United States Patent [19]
Scheiner et al.

[11] Patent Number: 6,100,985
[45] Date of Patent: Aug. 8, 2000

[54] METHOD AND APPARATUS FOR MEASUREMENTS OF PATTERNED STRUCTURES

[75] Inventors: David Scheiner, Ganei Yehuda; Moshe Finarov, Rehovot, both of Israel

[73] Assignee: Nova Measuring Instruments, Ltd., Rehovet, Israel

[21] Appl. No.: 09/267,989

[22] Filed: Mar. 12, 1999

[51] Int. Cl.[7] ........................ G01B 11/06; G01B 11/00; G01N 21/00; G01J 1/42

[52] U.S. Cl. ..................... 356/381; 356/357; 356/372; 356/237.5; 250/372; 250/341

[58] Field of Search .................... 356/372, 357, 356/381, 237.5, 382, 384; 250/372, 341

[56] References Cited

U.S. PATENT DOCUMENTS

| | | |
|---|---|---|
| 4,740,082 | 4/1988 | Young . |
| 4,899,055 | 2/1990 | Adams ................................ 250/372 |
| 4,999,014 | 3/1991 | Gold et al. . |
| 5,087,121 | 2/1992 | Kakuchi et al. . |
| 5,361,137 | 11/1994 | Aton et al. . |
| 5,702,956 | 12/1997 | Ying et al. . |
| 5,867,276 | 2/1999 | McNeil et al. ........................ 356/445 |
| 5,898,500 | 4/1999 | Canteloup et al. .................... 356/357 |
| 5,900,633 | 3/1999 | Solomon et al. . |
| 5,946,102 | 8/1999 | Holcomb ............................... 356/417 |
| 5,959,731 | 9/1999 | Jones ..................................... 356/357 |

OTHER PUBLICATIONS

Y. Ushio, T. Ueda, H. Nakahira, E. Matsukawa, M. Koyama, "In–Situ Monitoring of CMP Process Utilizing 0–Order Spectrometry", *CMP–MIC Conferences*, Feb. 11–12, 1999, pp. 23–29.

*Primary Examiner*—Frank G. Font
*Assistant Examiner*—Roy M. Punnoose
*Attorney, Agent, or Firm*—Greer, Burns & Crain, Ltd.

[57] ABSTRACT

A method for measuring at least one desired parameter of a patterned structure having a plurality of features defined by a certain process of its manufacturing. The structure represents a grid having at least one cycle formed of at least two locally adjacent elements having different optical properties in respect of an incident radiation. An optical model, based on at least some of the features of the structure is provided. The model is capable of determining theoretical data representative of photometric intensities of light components of different wavelengths specularly reflected from the structure and of calculating said at least one desired parameter of the structure. A measurement area, which is substantially larger than a surface area of the structure defined by the grid cycle, is illuminated by an incident radiation of a preset substantially wide wavelength range. Light component substantially specularly reflected from the measurement area is detected and measured data representative of photometric intensities of each wavelength within the wavelength range is obtained. The measured and theoretical data are analyzed and the optical model is optimized until the theoretical data satisfies a predetermined condition. Upon detecting that the predetermined condition is satisfied, said at least one parameter of the structure is calculated.

35 Claims, 7 Drawing Sheets

METHOD AND APPARATUS FOR MEASUREMENTS OF PATTERNED STRUCTURES

FIELD OF THE INVENTION

This invention is in the field of measurement techniques and relates to a method and a system for measuring the parameters of patterned structures.

BACKGROUND OF THE INVENTION

Techniques for thickness measurements of patterned structures have been developed., The term "patterned structure" used herein, signifies a structure formed with regions having different optical properties with respect to an incident radiation. More particularly, a patterned structure represents a grid having one or more cycles, each cycle being formed of at least two different locally adjacent stacks. Each stack is comprised of layers having different optical properties.

Production of integrated circuits on semiconductor wafers requires maintaining tight control over the dimensions of small structures. Certain measuring techniques enable the local dimensions of a wafer to be measured with relatively high resolution, but at the expense of discontinued use of the wafer in production. For example, inspection using a scanning electron microscope gives measurements of the parameters of a patterned structure, but at the expense of cleaving it and thus excluding it from continued processing. Mass production of patterned structures such as wafers requires a non-destructive process for controlling thin film parameters in a manner enabling the local measurements to be performed.

One kind of the conventional techniques for measuring thickness of thin films is disclosed in U.S. Pat. No. 4,999,014. The technique is based on the use of small spot size and large numerical aperture for measurements on small areas. Unfortunately, in the case of a very small structure, this approach suffers from a common drawback associated, on the one hand, with the use of a small spot-size and, on the other hand, owing to the large numerical aperture, with the collection of high diffraction orders. The term "small spot-size" signifies the spot diameter similar in size to the line or space width of the measured structure, i.e. a single grid cycle. This leads to various problems, which are difficult to solve. Indeed, not all the stacks' layers arc in the focus of an optical system used for collecting reflected light, the optical system being bulky and complicated, Detected signals are sensitive to small details of a grid profile and to small deviations in the spot placement. Diffraction effects, which depend significantly on the grid profile and topography and therefore are difficult to model, have to be included in calculations.

Another example of the conventional techniques of the kind specified is disclosed in U.S. Pat. No. 5,361,137 and relates to a method and an apparatus for measuring the submicron linewidths of a patterned structure. The measurements are performed on a so-called "test pattern" in the form of a diffraction grating, which is placed in a test area of the wafer. Here, as in most conventional systems, a monochromatic incident light is employed and diffraction patterns are produced and analyzed. However, a large number of test areas are used and also information on multiple parameters cannot be obtained.

According to some conventional techniques, for example that disclosed in U.S. Pat. No. 5.087,121, portions with and without trenches are separately illuminated with broadband light, the reflection spectrum is measured and corresponding results are compared to each other with the result being the height or depth of a structure. However, it is often the case that the structure under inspection is such that the different portions cannot be separately imaged. This is owing to an unavoidable limitation associated with the diameter of a beam of incident radiation striking the structure.

The above approach utilizes frequency filtering to enable separation of interference signals from different layers. This is not feasible for layers of small thickness and small thickness difference because of a limited number of reflection oscillations.

Yet another example of the conventional technique for implementing depth measurements is disclosed in U.S. Pat. No. 5,702,956. The method is based on the use of a test site that represents a patterned structure similar to that of the wafer (circuit site), but taken in an enlarged scale. The test site is in the form of a plurality of test areas each located in the space between two locally adjacent circuit areas. The test areas arc designed so as to be large enough to have a trench depth measured by an in-line measuring tool. The measurements are performed by comparing the parameters of different test areas assuming that the process is independent of feature size. For many processes in the field such as etching and photoresist development, this assumption is incorrect and this method is therefor inapplicable.

SUMMARY OF THE INVENTION

It is a major object of the present invention to overcome the above listed and other disadvantages of the conventional techniques and provide a novel method and system for non-destructive, non-contact measurements of the parameters of patterned structures.

It is a further object of the invention to provide such a method and system that enables the relatively small amount of information representative of the structure's conditions to be obtained and successfully processed for carrying out the measurements, even of very complicated structures.

According to one aspect of the present invention, there is provided a method for measuring at least one desired parameter of a patterned structure which comprises a grid having at least one cycle formed of at least two locally adjacent stacks having different optical properties in respect of an incident radiation, the structure having a plurality of features defined by a certain process of its manufacturing, the method comprising the steps of:

(a) providing an optical model based on at least some of said features of the structure and capable of determining theoretical data representative of photometric intensities of light components of different wavelengths specularly reflected from the structure and of calculating said at least one desired parameter of the structure;

(b) illuminating a measurement area by an incident radiation of a preset substantially wide wavelength range, the measurement area being substantially larger than a surface area of the structure defined by the grid cycle;

(c) detecting light reflected from the illuminated part substantially at zero-order and obtaining measured data representative of photometric intensities of each wavelength within said wavelength range;

(d) analyzing the measured and theoretical data for optimizing said optical model until the theoretical data satisfies a predetermined condition; and (e) upon detecting that the predetermined condition is satisfied, calculating said at least one parameter of the structure.

Thus, the main idea of the present invention consists of the following. A patterned structure, whose parameters are to be measured, is manufactured by several sequential steps of a certain technological process completed prior to the measurements. Actual design-rule features can often be found in the structure in sets (e.g. read lines in memories). The term "design-rule features" signifies a predetermined set of the allowed pattern dimensions used throughout the wafer. Hence, information regarding the desired parameters can be obtained using super-micron tools such as a large spot focused on a set of lines.

The present invention, as distinct from the conventional approach, utilizes a spectrophotometer that receives reflected light substantially from zero-order. The zero-order signal is not sensitive to small details of the grid profile of the structure such as edge rounding or local slopes. This enables the effects associated with diffracted light not to be considered, and thereby the optical model, as well as the optical system, to be simplified. Moreover, the large spot-size enables large depth of focus that includes the whole depth of the structure to be measured. When the spot includes a number of grid cycles, then the measurement is insensitive to local defects, exact spot placement or focusing.

In the case of wafers, each such element in the grid cycle consists of a stack of different layers. The features of such a structure (wafer), which are dictated by the manufacturing process and should be considered by the optical model, may be representative of the following known effects:

specular reflection from the different stacks within the grid cycle;

interference of reflected light from layers within each stack;

dissipation within transparent stacks due to cavity-like geometry formed in the grid-like structure;

specular contributions due to width of stacks relative to the wavelength;

polarization due to the incident beam interaction with a conductive grid-like structure, if present;

effects due to limited coherence of illumination;

interference between light beams reflected from each stack within the grid cycle, taking into account the above effects.

The contribution of each of the above effects into the theoretical data are estimated in accordance with the known physical laws.

The optical model, being based on some of the features, actually requires certain optical model factors to be considered in order to perform precise calculations of the desired parameters. If information of all the features is not available and the model cannot be optimized prior to the measurements, this is done by means of a so-called initial "learning" step. More specifically, there are some optical model factors which, on the one hand, depend variably on all the features and, on the other hand, define the contribution of each of the existing optical effects into the detected signal. The values of these optical model factors are adjusted along with the unknown desired parameters during the learning step so as to satisfy the predetermined condition. The latter is typically in the form of a merit function defining a so-called "goodness of fit" between the measured and theoretical data. The resulting optical model factors can consequently be used in conjunction with known features to enable precise calculations of the desired parameters of the structure.

Preferably, the measurement area is the part of the structure to be measured. Alternatively, the measurement area is located on a test pattern representative of the actual structure to be measured, namely having the same design rules and layer stacks. The need for such a test pattern may be caused by one of the following two reasons:

1) If the measurement area is not substantially smaller than the available surface area defined by the actual structure to be measured, then the test site is implemented so as to include an extended structure;

2) If the structure is very complicated or consists of ambiguous under-layer structure, then the test site is implemented with she same geometry as that of the actual structure to be measured, but with a simplified under-layer design, thus allowing simplified measurements of the top layers.

According to another aspect of the present invention, there is provided an apparatus for measuring at least one desired parameter of a patterned structure that represents a grid having at least one grid cycle formed of at least two locally adjacent elements having different optical properties in respect of an incident radiation, the structure having a plurality of features defined by a certain process of its manufacturing the apparatus comprising:

a spectrophotometer illuminating a measurement area by an incident radiation of a preset substantially wide wavelength range and detecting a specular reflection light component of light reflected from the measurement area for providing measured data representative of photometric intensities of detected light within said wavelength range, wherein the measurement area is substantially larger than a surface area of the structure defined by the grid cycle; and a processor unit coupled to the spectrophotometer, the processor unit comprising a pattern recognition software and a translation means so as to be responsive to said measured data and locate measurements, the processor being adapted for applying an optical model based on at least some of said features of the structure for providing theoretical data representative of photometric intensities of light specularly reflected from the structure within said wavelength range and calculating said at least one desired parameter, and comparing said measured and theoretical data and detecting whether the theoretical data satisfies a predetermined condition.

Preferably, the spectrophotometer is provided with an aperture stop accommodated in the optical path of the specular reflected light component. The diameter of the aperture stop is set automatically according to the grid cycle of the measured structure.

Preferably, the incident radiation and the reflected light received by the detector are directed along substantially specular reflection axes.

More particularly, the invention is concerned with measuring height/depth and width dimensions on semiconductor wafers and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1A:
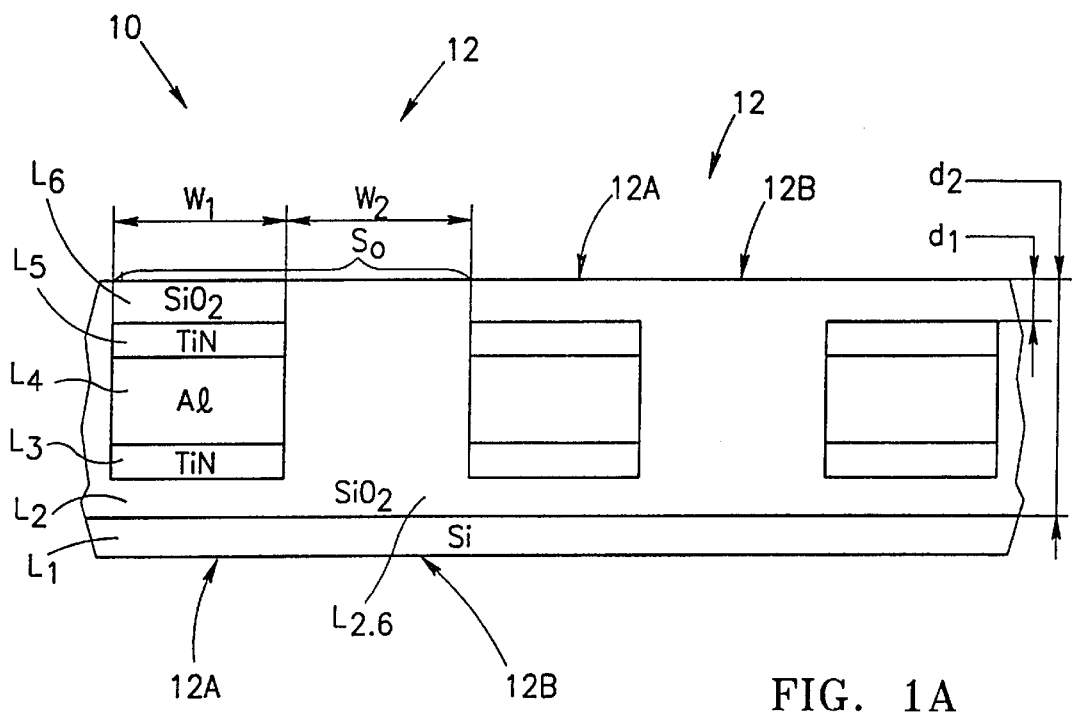
FIGS. 1*a* and 1*b* are, respectively, schematic cross-sectional and top views of one kind of a patterned structure to be measured.
Figure 1B:
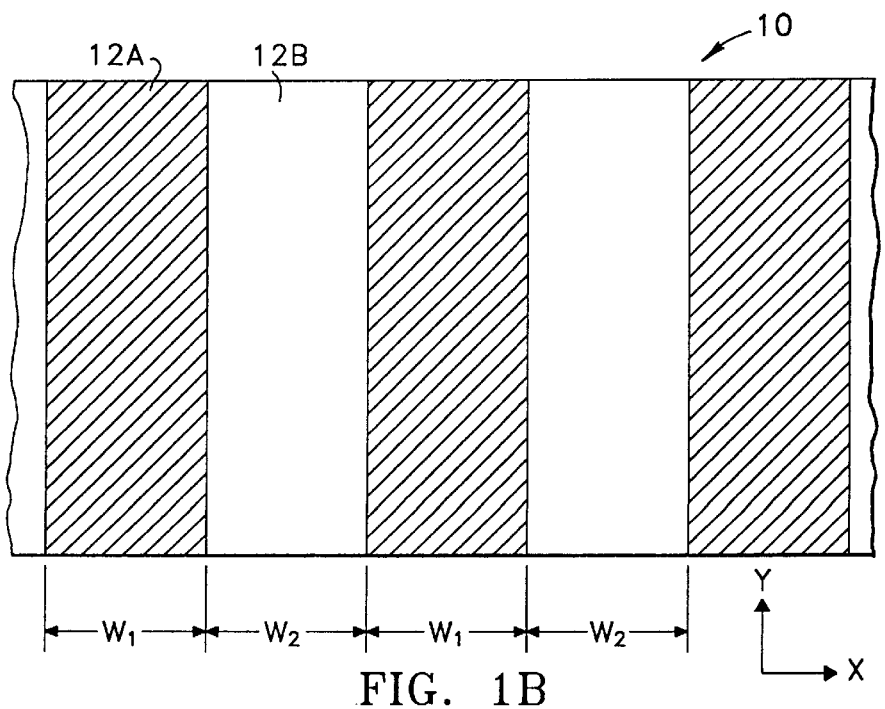

Referring to FIGS. 1a and 1b, there are partly illustrated a cross-section and a top view, respectively, of a grid-like wafer structure, generally designated 10, whose parameters are to be measured. The structure is formed of a plurality of cells, generally at 12, each constituting a grid cycle. Only three adjacent cells 12 are demonstrated in the present example with only two stacks (or elements) in each cell in order to simplify the illustration. Thus, the cell 12 comprises two stacks 12a and 12b formed of different layers. More specifically, the stack 12a includes six layers $L_1$–$L_6$, wherein the layers $L_1$ and $L_2$ and the layer $L_6$ form two layers $L_1$ and $L_{2,6}$, respectively, of the stack 12b. As known in the conventional semiconductor devices, semiconductor structures such as sources, drains and gate electrodes, capacitors, etc. are formed in and on a semiconductor substrate (layer $L_1$) typically made of silicon material and including metal conductors (e.g. aluminum). The substrate is coated by an insulating silicon oxide compound (layer $L_2$). The first level metal layer $L_4$ (and the single level in the present example) is formed, being interposed between top and bottom barrier layer $L_3$ and $L_5$ made of titanium nitride (TiN). Deposition coating of an uppermost insulating silicon oxide layer $L_6$ and subsequent chemical mechanical polishing (CMP), consisting of thinning the uppermost layer $L_6$, completes the manufacturing. The construction of such a structure and method of its manufacturing are known per se and therefore need not be more specifically described.

Figure 2:
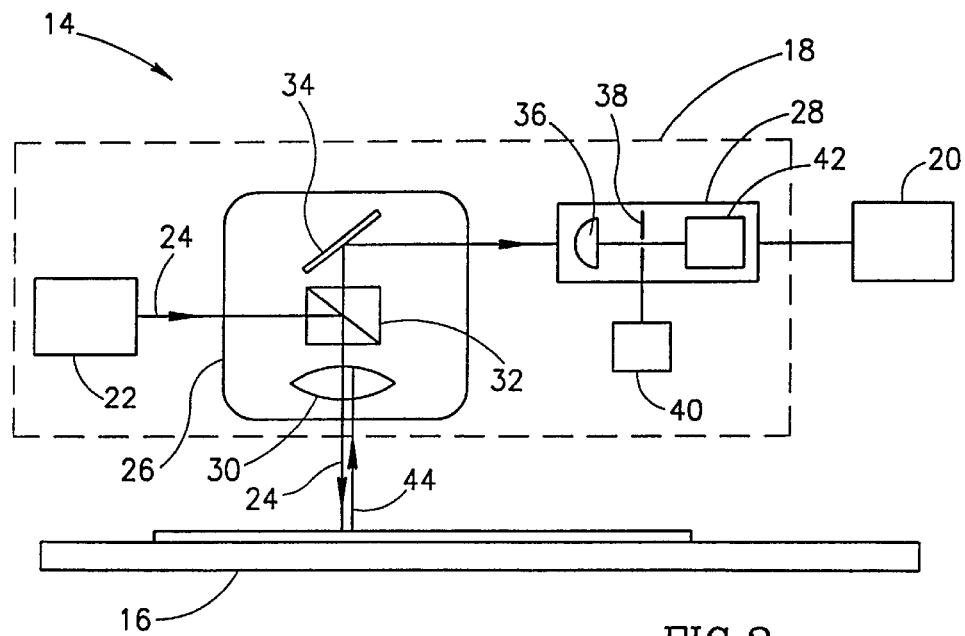
FIG. 2 schematically illustrates the main components of an apparatus according to the invention for measuring the parameters of a patterned structure.

According to this specific example, the parameters to be measured are the widths $W_1$ and $W_2$ of the stacks 12a and 12b and depths $d_1$ and $d_2$ of the uppermost silicon oxide layers $L_6$ and $L_{2,6}$, respectively. It is appreciated that any other parameters of the patterned structure such as, for example, materials and their optical properties, can be measured. Reference is now made to FIG. 2 illustrating a system, generally designated 14, suitable for carrying out the measurements. The system 14 may represent one of the working stations of a production line (not shown), the wafers 10 progressing between upstream and downstream stations of the production line. The system 14 comprises a support frame 16 for holding the structure 10 within an inspection plane, a spectrophotometer 18 and a processor unit 20 connected thereto. The spectrophotometer 18 typically includes a light source 22 for generating a beam of light 24 of a predetermined wavelength range, light directing optics 26 and a detector unit 28. The light directing optics 26 are typically in the form of a beam deflector comprising an objective lens 30, a beam splitter 32 and a mirror 34. The detector unit 28 typically comprises an imaging lens 36, a variable aperture stop 38 coupled to and operated by its motor 40 and a spectrophotometric detector 42. The construction and operation of the spectrophotometer 18 may be of any known kind, for example, such as disclosed in U.S. Pat. No. 5,517,312 assigned to the assignee of the present application. Therefore, the spectrophotometer 18 need not be more specifically described, except to note the following.

The light beam 24 passes through the light directing optics 26 and impinges onto the structure 10 at a certain location defining a measurement area $S_1$. Light component 44 specularly reflected from the reflective regions within the area $S_1$ is directed onto the detector unit 28.

It should be noted that, generally, the illuminated location of the structure may be larger than the measurement area $S_1$, in which case suitable optics are provided for capturing, in a conventional manner, light reflected solely from the part (area $S_1$) within the illuminated location. In other words, the measurement area being of interest is included into a spot-size provided by the light beam 24 when impinging onto the structure 10. In order to facilitate understanding, assume that the illuminated area defined by the diameter of the incident beam constitutes the measurement area $S_1$.

The light directing optics 26 and detector unit 28 are designed such that only a zero-order light component of light reflected from the structure 10 is sensed by the spectrophotometric detector 42. The construction is such that the incident and detected light beams are directed substantially parallel to each other and substantially perpendicular to the surface of the structure 10. The diameter of the aperture stop 38 is variable and is set automatically according to the grid cycle of the measured structure Generally speaking, the diameter of the aperture stop is optimized to collect the maximum reflected intensity excluding diffraction orders.

Additionally, the diameter of the incident beam 24, defining the measurement area $S_1$, is substantially larger than the surface area $S_o$ defined by the cell 12, that is: According to this specific example, the patterned structure 10 is a so-called "one-dimensional" structure. As clearly seen in FIG. 1b, the stacks 12a and 12b are aligned along the X-axis, while along the Y-axis toe stacks continue to infinity (uniform structure) with respect to the measurement area $S_1$. In other words, the measurement area $S_1$ includes a structure that has one or more grid cycles extending along the X-axis and is uniform along the Y-axis.

The whole surface area S of the structure under inspection should be substantially larger than the measurement area $S_1$ defined by the diameter of the incident beam.

$S > S_1$

The case may be such that the above conditions are not available in the structure 10. For example, the structure may contain a single grid cycle. To this end, the measurement area $S_1$ consisting of more than one cell 12 should be located on a test-site (not shown).

For example, if the system 14 provides the numerical aperture of 0.2 and spot-diameter (measurement area $S_1$) about 15 µm, the minimum surface area S of a test-site should be 20 µm. NovaScan 210 spectrophotometer, commercially available from Nova Measuring Instruments Ltd., Israel, may be used in the system 14.

Figure 3:
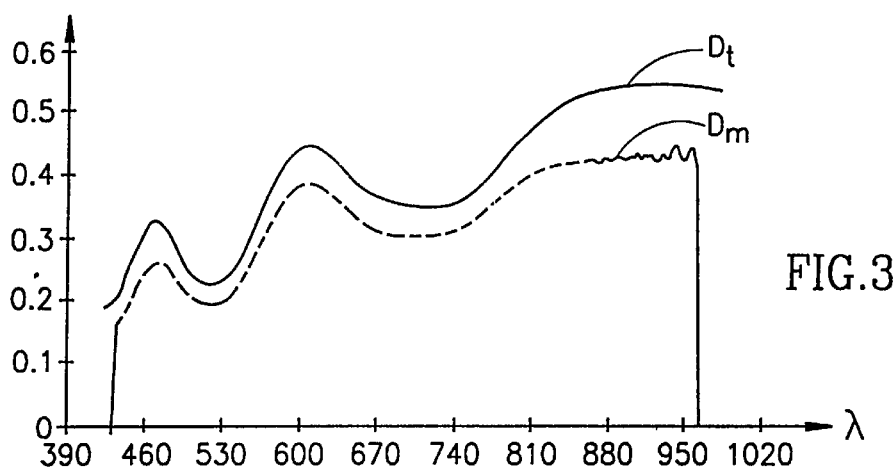
FIG. 3 is a graphical illustration of the main principles of the present invention, showing the relationship between measured and theoretical data obtained by the apparatus of FIG. 2.

The spectrophotometer 18 measures the photometric intensities of different wavelengths contained in the detected, zero-order light component of the reflected beam 44. This is graphically illustrated in FIG. 3, being shown as a dashed curve $D_m$ constituting the measured data. The processor unit 20 comprises a pattern recognition software and a translation means so as to be responsive to the measured data and locate measurements. It is pre-programed by a certain optical model based on at least some features of the structure for calculating theoretically the photometric intensities of light of different wavelengths reflected from a patterned structure. This is shown in FIG. 3 as a solid curve $D_t$, constituting theoretical data In order to design the optical model capable of estimating all the possible optical effects, which are dictated by the features of the structure to be measured and affect the resulting data, the following should be considered.

Generally, total specular reflection R from the grid-like structure is formed of a coherent part $R_{coh}$ and an incoherent part $R_{incoh}$. It is known that coherence effects play an essential role in the measurements when a wide bandwidth radiation is used. The coherence length L of light in the optical system is determined by the radiation source and by the optical system (spectrophotometer) itself. Reflection amplitudes from structure's features smaller than the coherence length interact coherently, producing thereby interference effects between light reflected by different stacks of the cell. For larger features, a non-negligible portion of light reflected by different stacks undergoes incoherent interaction without producing interference. The coherence length L defines a mutual coherence $v$ of light, coming from points separated by half a cycle of the grid structure, and, consequently, defines the degree of coherence $\gamma$, that is:

$$L = D \cdot \lambda$$
$$v = \frac{2 \cdot \pi \cdot (W_1 + W_2)}{2 \cdot L}$$
$$\gamma = \left(\frac{2 \cdot J_1(v)}{v}\right)^2$$

wherein D is a variable parameter determined experimentally for the actual optical system and stack structure based on the measured reflection spectra (measured data) for grids of varied cycle dimensions; $J_1$ is a known Bessel function. An approximate initial input for the determination of the parameter D may be given by nominal optical system characteristics. Hence, the total specular reflection R is given:

$$R = \gamma \cdot R_{coh} + (1-\gamma) R_{incoh}$$

In order to estimate the possible optical effects affecting the above parts of the total reflected signal the following main factors should be considered, being exemplified with respect to the patterned structure 10 (FIGS. 1$a$ and 1$b$):

1) Filling factors $\alpha_1$ and $\alpha_2$:

$$a_1 = \frac{W_1}{W_1 + W_2}$$
$$a_2 = \frac{W_2}{W_1 + W_2}$$

These factors represent the zero-order contribution, which is based only on the ratio of the areas of stacks 12$a$ and 12$b$. respectively, in the reflection calculation. The zero-order signal is not sensitive to small details of the arid profile of the structure 10 such as edge rounding or local slopes. Therefore, the effects associated with diffracted light may not be considered.

2) Size coupling factors $c_1$ and $c_2$:
When the width of the stack is close to the wavelength, the filling factors $\alpha_1$ and $\alpha_2$ should be corrected for reducing the coupling of the incident radiation to the respective stack. To this end, so-called "coupling factors" $c_1$ and $c_2$ should be introduced to the filling factors $\alpha_1$ and $\alpha_2$, respectively. The coupling factor gives a negligible effect when the width of the stack is relatively large relative to the wavelength and negates the interaction completely when the stack width is much smaller than the wavelength. Using a heuristic exponential function to give this dependence, the coupling factors are as follows:

$$c_1 = \exp\left\{-A \cdot \exp\frac{\lambda}{W_1}\right\}$$
$$c_2 = \exp\left\{-A \cdot \exp\frac{\lambda}{W_2}\right\}$$

wherein $\lambda$ is the wavelength of a respective light component; A is a variable factor depending on the dimensions and materials of the structure and is determined experimentally for the actual stack structure, as will be described father below.

3) Dissipation $b_2$ in cavity-like structures:

It is often the case that one of the stacks is essentially dissipative owing to geometrical effects reducing reflection, which effects typically take place in cavity-like structures. Among these geometrical effects are high aspect-ratio trenches and wave-guiding underneath metal grid-like structures. High aspect-ratio structures are characterized by a dissipative effect that decreases the amount of light reflected back out with phase impact. For example, multiple reflections in deep grooves in metal both reduces the amount of light reflected back out and destroys the phase relation. The above effects are relatively strong for deep geometry and relatively weak for shallow structures (relative to the wavelength). Using a heuristic exponential function to give this dependence, a dissipation factor $b_2$ is given:

$$b_2 = \exp\left\{-B \cdot \frac{d_2}{\lambda}\right\}$$

wherein B is a variable size parameter, which is determined experimentally for the actual stack structure; $d_2$ is the depth of the cavity-like part of the stack. Here, by way of example only, the stack 12$b$ is defined as a dissipative one.

In order to model the corrected filling factors, it is assumed that light radiation not reflected from a certain cell's stack from coupling considerations is essentially reflected by other cell's stack(s). The dissipation factor $b_2$ is taken into account in the reduced effective filling factor of the geometrically dissipative area. Hence, the corrected filling factors are as found;

$$A_1 = \alpha_1 \cdot c_1 + \alpha_2 \cdot (1-c_2)$$
$$A_2 = (\alpha_2 \cdot c_2 + \alpha_1 \cdot (1-c_1)) \cdot b_2$$

4) Polarization factors, representing the contribution of polarization effects that may take place in the case of metallic grids:

When the width of a cell's stack is close to the wavelength, a corrective factor should be introduced for reducing the couplin, of the incident TE radiation to the respective stack owing to boundary conditions at the edges of metal lines. The polarization factor gives a negligible effect when the width of the stack is large relative to the wavelength and negates the reflection completely when the stack width is much smaller than the wavelength. Hence, the polarization factors $p_1$ and $p_2$ are given:

$$p_1 = \exp\left\{-C\frac{\lambda}{W_1}\right\}$$

$$p_2 = \exp\left\{-C\frac{\lambda}{W_2}\right\}$$

wherein C is a variable parameter determined experimentally for the actual stack structure. It is appreciated that in the absence of a pattern formed of metal lines, the optical factor C is equal to zero.

Similarly, in order to model the corrected filling factors, it is assumed that light radiation not reflected from a certain cell's stack from polarization considerations is essentially reflected by other cell's stack(s). Hence, the corrected filling factors are as found:

$$A_1 = a_1 \cdot c_1 \cdot p_1 + a_2 \cdot (1 - c_2 \cdot p_2)$$

$$A_2 = (a_2 \cdot c_2 \cdot p_2 + a_1 \cdot (1 - c_1 \cdot p_1)) \cdot b_2$$

The intensity of a reflected signal $r(\lambda)$ from each stack is calculated using layer thickness information and material optical parameters (constituting known features). To this end, standard equations for reflection from multi-layered stacks are used, based on Fresnel coefficients for reflection and transmission at interfaces as a function of wavelength for perpendicular incidence. The thickness for each layer is either known (being provided by the user) or calculated internally by the program. The materials of the layers and, therefore, their optical parameters, such as refraction indices and absorption, are known or calculated.

In view of the above and considering that both the coherent and incoherent parts contain contributions from two polarizations (e.g. $R_{coh} = R^{(p)} + R^{(s)}$), the total reflection R constituting the theoretical data obtained by the optical model, is given:

$$R = \{|r_1 \cdot A_{1P} + r_2 \cdot A_{2P}|^2 + |r_1 \cdot A_{1S} + r_2 \cdot A_{2S}|^2\} \cdot \frac{\gamma}{2} +$$
$$\{|r_1|^2 \cdot A_{1P}^2 + |r_2|^2 \cdot A_{2P}^2 + |r_1|^2 \cdot A_{1S}^2 + |r_2|^2 \cdot A_{2S}^2\} \cdot \frac{1-\gamma}{2}$$

wherein $r_1$ and $r_2$ are the amplitudes of reflection from first and second stacks, respectively, of the cell, that is stacks 12a and 12b in the present example.

Other effects known in common practice (such as lateral reflection, roughness, etc.) have been found to have a, negligible contribution under the defined conditions and are accounted for by the adjustment of the parameters A, B, C and D. Turning back to FIG. 3, there is clearly illustrated that the curves $D_m$ and $D_t$ do not coincide, that is the theoretical data does not exactly match the measured data. A suitable merit function is used for determining the goodness of fit of the obtained results. By setting the values of the optical model parameters A, B, C and D the optical model is defined. By fitting the values of the desired parameters, e.g. $W_1$, $W_2$, $d_1$ and $d_2$, the theoretical data is optimized until the goodness of fit reaches a certain desired value (constituting a required condition). Upon detecting that the optimized theoretical data satisfies the required condition, the desired parameters of the structure, i.e. the $W_1$, $W_2$, $d_1$ and $d_2$ are calculated from the above equations.

It should be noted that in the most general case, when the grid cycle comprises two or more locally adjacent different elements (e.g., stacks), the above optical model is still correct. The mutual coherence v' is as follows:

$$v' = \frac{\pi}{L}\sum_{i=1}^{n}W_i$$

wherein i is the i-th element (stack) in the grid cycle; n is the total number of elements within the grid cycle, and L is the coherence length. For the main factors on which the above optical model is based, we have:

Filling factor $$a_i = \frac{W_i}{\sum_{i=1}^{n}W_i}$$

Coupling factor $$c_i = \exp\left(-A \cdot \exp\frac{\lambda}{W_i}\right)$$

Dissipation factor $$b_m = \exp\left\{-B_m\frac{d_m}{\lambda}\right\}$$

wherein m is the number of a dissipative element of the n stacks; $d_m$ is the depth of the cavity-like part of the stack in relation to the neighboring stacks. For a non-dissipative stack, $b_n = 1$, wherein $n \neq m$.

Polarization factor $$p_i = \exp\left\{-C \cdot \frac{\lambda}{W_i}\right\}$$

Corrected filling factor $$A_j \simeq b_i \cdot \left[a_i \cdot c_i \cdot p_i + \sum_{j=1(j\neq i)}^{n} a_j(1 - c_j \cdot p_j)\right]$$

In view of the above, the total reflection is as follows:

$$R' = \left\{\left|\sum_i (r_i \cdot A_{ip})\right|^2 + \left|\sum_i (r_i \cdot A_{is})\right|^2\right\} \cdot \frac{\gamma}{2} +$$
$$\left\{\sum_i (|r_i|^2 \cdot A_{ip}^2) + \sum_i (|r_i|^2 \cdot A_{is}^2)\right\} \cdot \frac{1-\gamma}{2}$$

Figure 4:
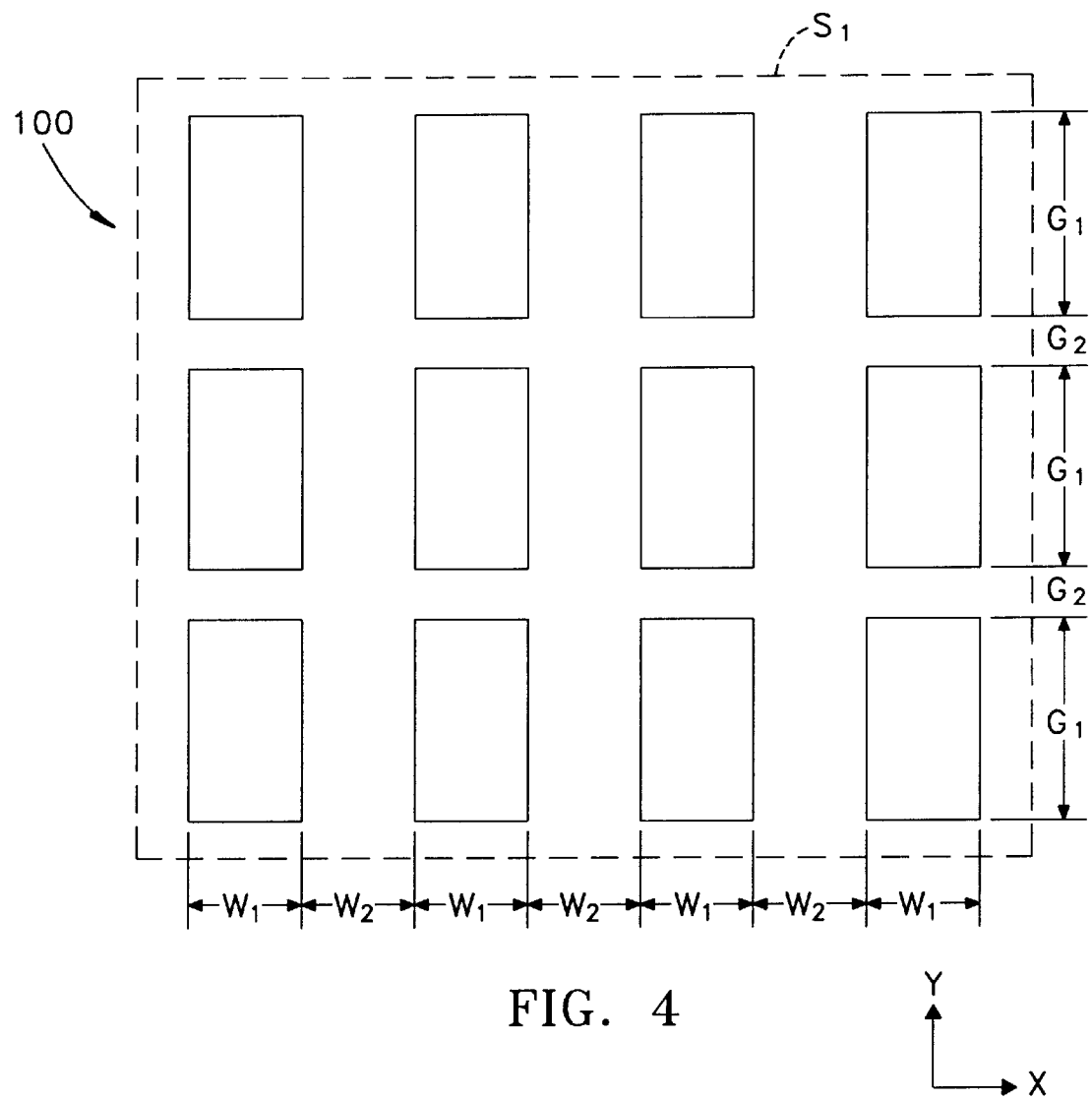
FIG. 4 illustrates yet another example of a patterned structure to be measured with the apparatus of FIG. 3.

Referring, to FIG. 4, there is illustrated a part of a so-called "two-dimensional" structure 100, i.e. a structure periodical in both X- and Y-axes. This structure 100 is characterized by a plurality of grid cycles aligned along both the X- and Y-axes. The cycle aligned along the X-axis is formed of a pair of elements $W_1$ and $W_2$ (the stacks' widths), and the cycle aligned along the Y-axis is formed of a pair of elements $G_1$ and $G_2$ (the stacks' lengths). For example, the elements $G_1$ and $G_2$ may be, respectively, a metal layer stack and a block of Inter Layer Dielectric (ILD) stack. The measurement area $S_1$ defined by the diameter of the incident beam includes at least one cycle in X-direction and at least one cycle in Y-direction (several cycles in the present example).

Generally speaking, the cycle in either X- or Y-axis may be composed of several elements (e.g., stacks). If the measurement area $S_1$ is smaller than the surface area defined by the grid cycle along one of the axes X or Y, the total reflection (theoretical data) is determined in the manner described above with respect to the one-dimensional structure 10 (FIGS. 1a and 1b). If the measurement area is larger than the surface area defined by the grid cycle along both X- and Y-axes, then for the total reflection $R_{2D}$ of such a 2D-structure we have:

$$R_{2-D} = \frac{G_1}{G_1 + G_2} \cdot R_{G_1} + \frac{G_2}{G_1 + G_2} \cdot R_{G_2}$$

wherein $R_{G1}$ and $R_{G2}$ are the intensities of reflection signals from the two one-dimensional structures aligned along the Y-axis and having the widths $G_1$ and $G_2$, respectively. It should be noted that the Y-axis is no more than a notation, i.e. has no physical significance, and can be exchanged with the X-axis. For the general case of k elements in the cycle aligned along the Y-axis, we have:

$$R_{2D} = \frac{\sum_{i=1}^{k} G_i \cdot R_{G_i}}{\sum_{i=1}^{k} G_i}$$

wherein $R_{Gi}$ and $G_i$ are the reflection intensity from and width of the i-th element.

In general, the axis location for calculating the reflection intensities $R_{Gi}$ is chosen so as to satisfy the following:

$$G_1+G_2>W_1+W_2$$

If the above condition is not satisfied, than the two axes are exchanged accordingly.

Figure 5A:
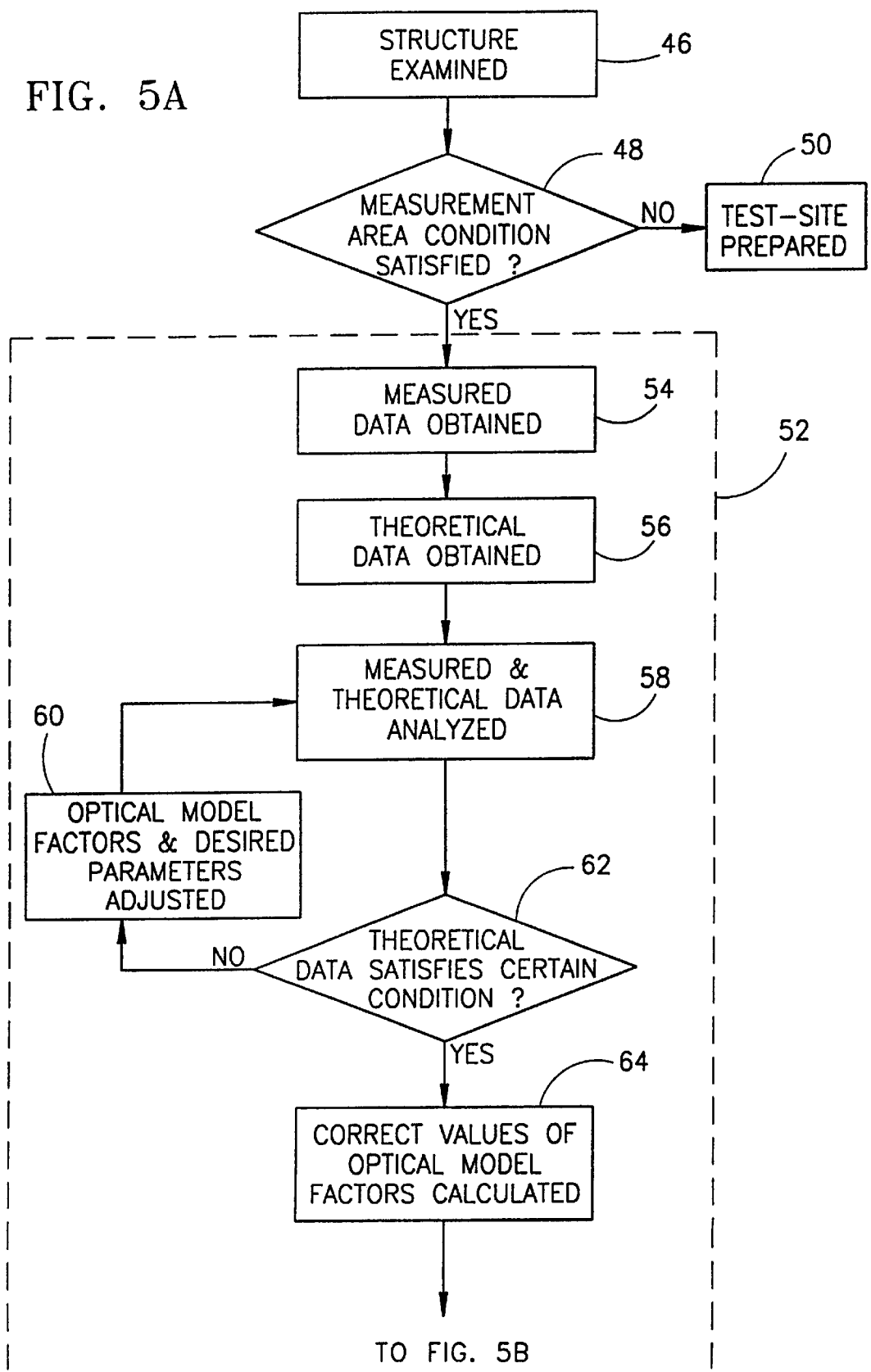
FIGS. 5a and 5b illustrate a flow diagram of the main steps of a method according to the invention.
Figure 5B:
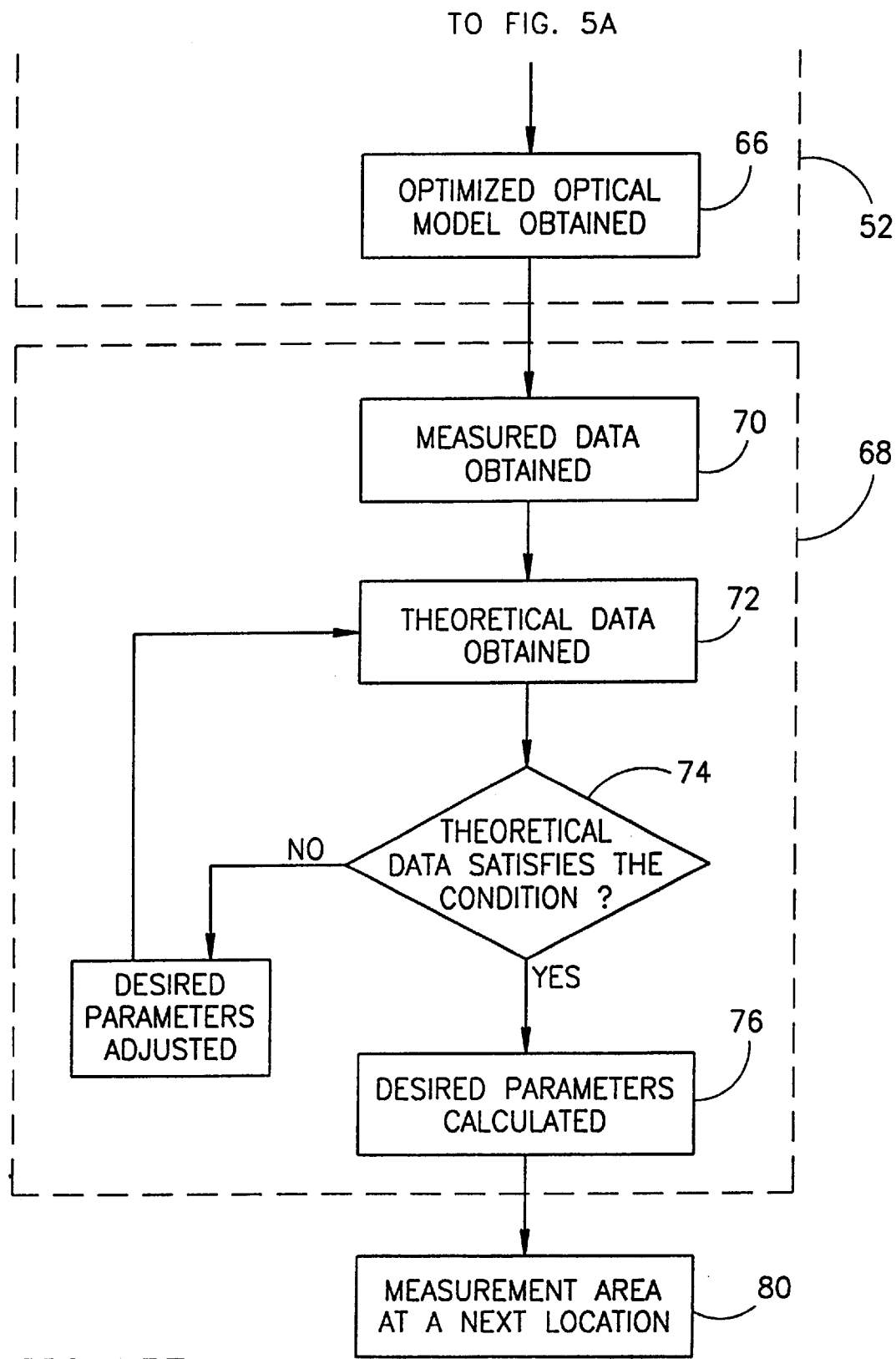

The main principles of a method according to the invention will now be described with reference to FIGS. 5a and 5b. The structure of the required measurement area is examined (step 46) so as to determine whether the above measurement area condition is satisfied within the existing pattern (step 48). If this condition is not satisfied, a test-site structure satisfying the condition is designed on the reticle (step 50), the test-site being typically provided within a so-called "margin region".

Then, an initial learning mode of operation is performed, generally at step 52. The learning mode is aimed, on the one hand, at providing the measured data and, on the other hand, at optimizing the optical model. During the learning mode, the system 14 operates in the manner described above for detecting light reflected from the illuminated area substantially at zero-order and obtaining the measured data in the form of photometric intensities of each wavelength within the wavelength range of the incident radiation (step 54). Concurrently, the processor 20 applies the above optical model for obtaining the theoretical data (step 56) and compares it to the measured data (step 58). The optical model is based on some known features of the structure and nominal values of unknown features (i.e. of the desired parameters to be measured) which are provided by the user. At this stage, the relation between the theoretical data, and the measured data is compared to a certain condition (step 62). If the condition is satisfied then, correct values of the parameters A, B, C and D are calculated (step 64) and an optimized optical model is obtained (step 66). If the condition is not satisfied then the optical model factors A, B, C and D and the unknown features are adjusted (step 60) until the condition is satisfied. It should be noted, although not specifically illustrated, that at this initial learning stage, the desired parameters can be calculated.

Thereafter the measurement mode of operation is performed, generally at step 68. To this end, the measured and theoretical data are concurrently produced (steps 70 and 72, respectively). It is appreciated that the theoretical data now produced is based on the known parameters of the structure, previously calculated correct values of the optical factors A, B, C and D and on the nominal values of the desired parameters to be measured. Similarly, the optimized theoretical data is compared to the measured data so as to determine whether or not the theoretical data satisfies a required condition (step 74), e.g. the goodness of fit is of a desired value. If so, the desired parameters are calculated (step 76) and if not, the desired parameters are adjusted (step 78) until the theoretical data substantially matches the measured data. If desired, the measurement mode (step 68) is then repeated for inspecting a further location on the structure 10 (step 80).

Figure 6:
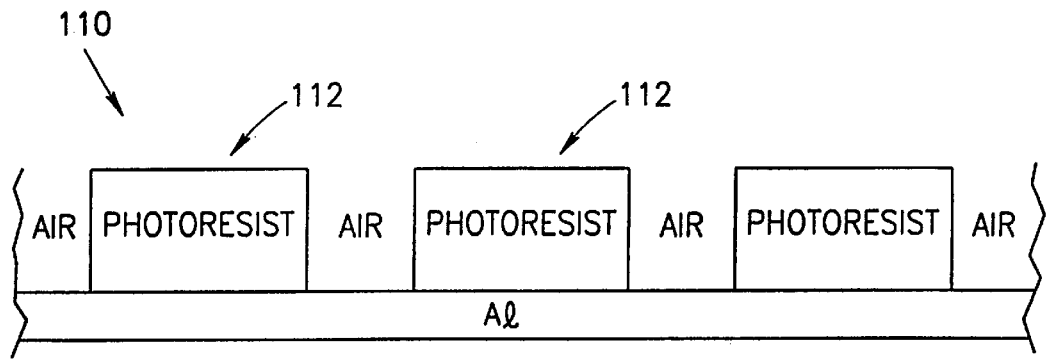
FIGS. 6 to 10 are schematic cross-sectional views of five more examples of patterned structures suitable to be inspected by the apparatus of FIG. 2.
Figure 7:
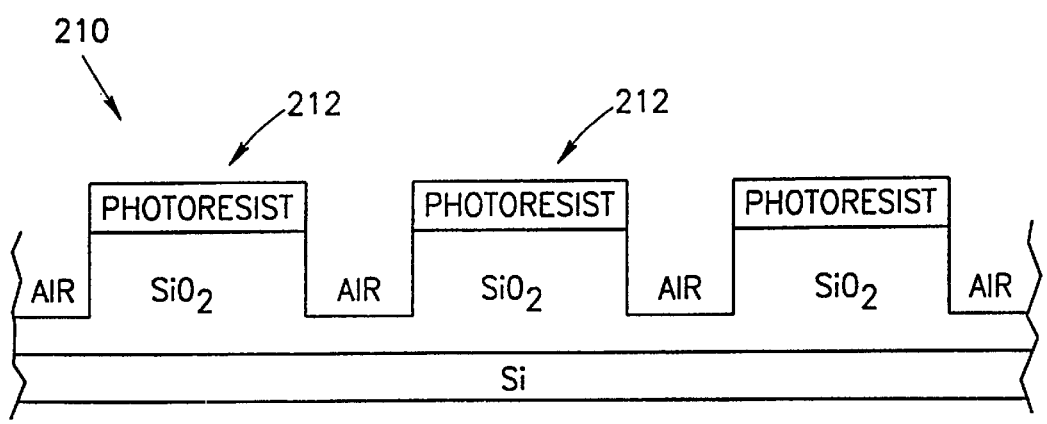

Referring to FIGS. 6 and 7, there are illustrated in a self-explanatory manner two examples of patterned structures, designated 110 and 210, respectively, which can be inspected in the above described manner by the system 14. Each of die structures 110 and 210 consists of cells 112 and 212, respectively, each cell including two stacks formed of different layers. The parameters to be measured in these structures are, respectively, the width of a photoresist layer on top of the aluminum and the depth of the etched area (Air) within the silicon oxide layer.

Figure 8:
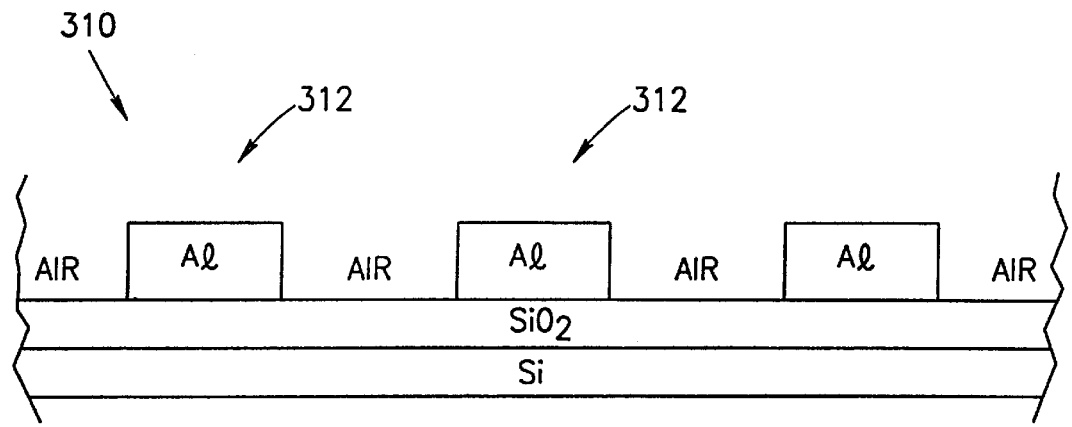
Figure 9:
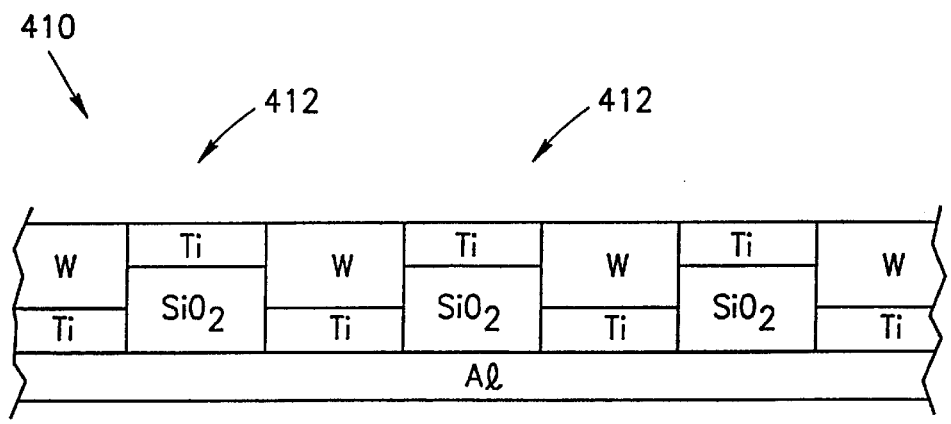

Referring to FIGS. 8 and 9, there are illustrated two more example of patterned structures, designated 310 and 410, respectively, whose parameters can be measured in accordance with the invention. Here, the parameters to be measured are, respectively, the width and thickness of an aluminum layer on top of the silicon oxide and the remaining thickness of the metallic layer on the silicon oxide layer undergoing chemical mechanical polishing.

It is appreciated that polarization effects are present in the structures 310 and 410 due to the existence of patterned metal in both structures, while being weak in the structures 110 and 210.

Figure 10:
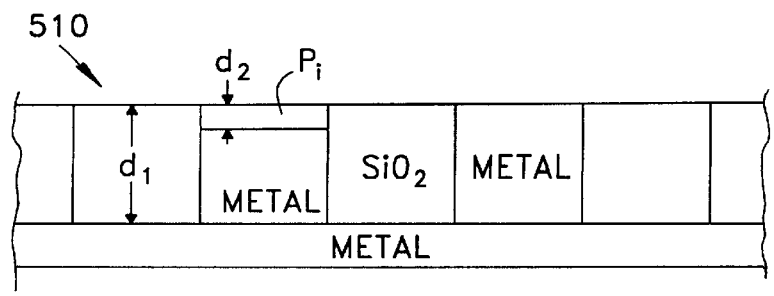

FIG. 10 illustrates a patterned structure 510 utilizing copper under and between any two $S_iO_2$-based layers known as Interlayer Dielectric (ILD) insulating layer. CMP process applied to such a copper-based structure 510 typically results in copper loss portions, generally at $P_i$, a so-called "dishing" effect. This effect is associated with the properties of copper (e.g., sorer nature as compared to other metals) and the chemical nature of the copper-based CMP process. The parameters to be measured are the depths $d_1$ and $d_2$ of, respectively, the uppermost ILD insulating layer and the dishing-associated portion $P_f$. In certain cases, depending on the layer stacks, the metal thickness can be determined by $(d_1-d_2)$.

Those skilled in the art will readily appreciate that many modifications and changes may be applied to the invention as hereinbefore exemplified without departing from its scope defined in and by the appended claims. For example, the patterned structure may comprise any other number of cells, each cell being formed of any other number of stacks. In the method claims that follow, characters, which are used to designate claim steps, are provided for convenience only and do not apply any particular order of performing the steps.

What is claimed is:

1. A method for measuring at least one desired parameter of a patterned structure which represents a grid having at least one cycle formed of at least two locally adjacent elements having different optical properties in respect of an incident radiation, the structure having a plurality of features defined by a certain process of its manufacturing, the method comprising the steps of:

a) providing an optical model, based on at least some of said features of the structure and capable of determining theoretical data representative of photometric intensities of light components of different wavelengths specularly reflected from the structure and of calculating said at least one desired parameter of the structure;

b) illuminating a measurement area by an incident radiation of a preset substantially wide wavelength range, the measurement area being substantially larger than a surface area of the structure defined by the grid cycle;

c) detecting light component substantially specularly reflected from the measurement area and obtaining measured data representative of photometric intensities of each wavelength within said wavelength range;

d) analyzing the measured data and the theoretical data and optimizing said optical model until said theoretical data satisfies a predetermined condition; and e) upon detecting that the predetermined condition is satisfied, calculating said at least one parameter of the structure.

2. The method according to claim 1, wherein said at least some features of the structure on which the optical model is based are available prior to measurements.

3. The method according to claim 1, wherein said at least some features of the structure on which the optical model is based comprises nominal values of said desired parameters to be measured.

4. The method according to claim 1, wherein said at least some features of the structure on which the optical model is based comprises materials forming each of said at least two elements.

5. The method according to claim 1, wherein the step of providing the optical model comprises the step of:

estimating known optical effects, that may be produced in the structure in response to the incident radiation, and contribution of said optical effects into the detected light component.

6. The method according to claim 1, wherein each of said at least two elements is a stack including layers having different optical properties.

7. The method according to claim 5, wherein each of said at least two elements is a stack including layers having different optical properties, and said estimating comprises:

i. estimating a specular reflection within the grid cycle associated with the width of stacks relative to the wavelength of the incident radiation and with dissipation in the stacks having a geometry that reduces reflection due to cavity-like structures;

ii. estimating interference in transparent layers within each stack and between light beams reflected from each stack within the grid cycle;

iii. estimating polarization associated with the interaction of the incident radiation with patterned conductive layers of the grid-like structure;

iv. estimating effects associated with coherence length of illumination.

8. The method according to claim 1, wherein said analyzing comprises the step of:

comparing the theoretical data with the measured data and providing data indicative of the relationship between the measured, and theoretical data.

9. The method according to claim 1, wherein said optimizing comprises the steps of:

adjusting certain variable factors of the optical model until the theoretical data satisfies the predetermined condition and obtaining correct values of the optical model factors.

10. The method according to claim 9, wherein said certain variable factors of the optical model define contributions of known optical effects into the detected light component.

11. The method according to claim 1, wherein said predetermined condition represents a merit function defining a certain value of a goodness of fit between the measured and theoretical data.

12. The method according to claim 1, wherein said optimizing comprises the step of:

adjusting said at least one desired parameter until the theoretical data satisfies the predetermine condition.

13. The method according to claim 1, wherein the measurement area is a part of the structure to be measured.

14. The method according to claim 1, wherein the measurement area is located on a test site representing a test pattern similar to that of the structure, the test pattern having the same design rules and layer stacks.

15. The method according to claim 1, wherein said theoretical data is determined according to the following equation:

$$R = \{|r_1 \cdot A_{1P} + r_2 \cdot A_{2P}|^2 + |r_1 \cdot A_{1S} + r_2 \cdot A_{2S}|^2\} \cdot \frac{\gamma}{2} +$$
$$\{|r_1|^2 \cdot A_{1P}^2 + |r_2|^2 \cdot A_{2P}^2 + |r_1|^2 \cdot A_{1S}^2 + |r_2|^2 \cdot A_{2S}^2\} \cdot \frac{1-\gamma}{2}$$

wherein $r_1$ and $r_2$ are the amplitudes of reflection signal from the two elements, respectively; $A_{1p}$, $A_{1s}$ and $A_{2p}$, $A_{2s}$ are filling factors corrected in accordance with effects of size-coupling dissipation in a cavity-like structure and s- and p-polarizations associated with the two elements, respectively; $\gamma$ is a degree of coherence.

16. The method according to claim 1, wherein said theoretical data is determined according to the following equation:

$$R' = \left\{ \left|\sum_i (r_i \cdot A_{ip})\right|^2 + \left|\sum_i (r_i \cdot A_{is})\right|^2 \right\} \cdot \frac{\gamma}{2} +$$
$$\left\{ \sum_i (|r_i|^2 \cdot A_{ip}^2) + \sum_i (|r_i|^2 \cdot A_{is}^2) \right\} \cdot \frac{1-\gamma}{2}$$

wherein $r_i$ is the amplitude of reflection signal from I-th element in said at least one cycle; $A_{ip}$ and $A_{is}$ are filling factors corrected in accordance with effects of dissipation in a cavity-like structure and s- and p-polarizations associated with the i-th element in said at least one cycle, respectively; $\gamma$ is a degree of coherence.

17. The method according to claim 1, wherein said structure comprises at least one additional cycle formed of at least two different locally adjacent elements aligned along an axis perpendicular to an axis of alignment of the elements of said at least one cycle.

18. The method according to claim 17, wherein said theoretical data is determined according to the following equation:

$$R_{2D} = \frac{\sum_{i=1}^{k} G_i \cdot R_{G_i}}{\sum_{i=1}^{k} G_i}$$

wherein $R_{Gi}$ and $G_i$ are the reflection intensity from and width of the i-th element; k is the total number of elements.

19. The method according to claim 1, wherein said at least one desired parameter to be measured is a width of at least one of said at least two locally adjacent elements in the grid cycle.

20. The method according to claim 6, wherein said at least one desired parameter to be measured is a width of at least one of said at least two locally adjacent elements in the grid cycle.

21. The method according to claim 6, wherein said at least one desired parameter to be measured is a depth of at least one layer of said at least one stack.

22. The method according to claim 6, wherein said at least one desired parameter to be measured is a depth of a metal-loss portion, resulting from a chemical mechanical polishing applied to said structure.

23. An apparatus for measuring at least one desired parameter of a patterned structure that represents a grid having at least one grid cycle formed of at least two locally adjacent elements having different optical properties in respect of an incident radiation, the structure having a plurality of features defined by a certain process of its manufacturing the apparatus comprising:
 a spectrophotometer illuminating a measurement area by an incident radiation of a preset substantially wide wavelength range and detecting a specular reflection light component of light reflected from the measurement area for providing measured data representative of photometric intensities of detected light within said wavelength range, wherein the measurement area is substantially larger than a surface area of the structure defined by the grid cycle; and
 a processor unit coupled to the spectrophotometer, the processor unit comprising a pattern recognition software and a translation means so as to be responsive to said measured data and locate measurements, the processor being adapted for
  applying an optical model based on at least some of said features of the structure for providing theoretical data representative of photometric intensities of light specularly reflected from the structure within said wavelength range and calculating said at least one desired parameter, and
  comparing said measured and theoretical data and detecting whether the theoretical data satisfies a predetermined condition.

24. The apparatus according to claim 23, wherein said spectrophotometer comprises a spectrophotometric detector and a variable aperture stop located in the optical path of light reaching the detector, the diameter of the aperture stop being variable in accordance with the grid cycle of the measured structure.

25. The apparatus according to claim 23, wherein said measurement area is located within the patterned area of said structure.

26. The apparatus according to claim 23, wherein said measurement are is located within a test site located outside the patterned area of said structure.

27. The apparatus according to claim 23, wherein said theoretical data is determined according to the following equation:

$$R = \{|r_1 \cdot A_{1P} + r_2 \cdot A_{2P}|^2 + |r_1 \cdot A_{1S} + r_2 \cdot A_{2S}|^2\} \cdot \frac{\gamma}{2} +$$
$$\{|r_1|^2 \cdot A_{1P}^2 + |r_2|^2 \cdot A_{2P}^2 + |r_1|^2 \cdot A_{1S}^2 + |r_2|^2 \cdot A_{2S}^2\} \cdot \frac{1-\gamma}{2}$$

wherein $r_1$ and $r_2$ are the amplitudes of reflection signal from the two elements, respectively; $A_{1p}$, $A_{1s}$ and $A_{2p}$, $A_{2s}$, are filling factors corrected in accordance with effects of size coupling and dissipation in a cavity-like structure and s- and p-polarizations associated with the two elements, respectively; $\gamma$ is a degree of coherence.

28. The apparatus according to claim 23, wherein said theoretical data is determined according to the following equation:

$$R' = \left\{\left|\sum_i (r_i \cdot A_{ip})\right|^2 + \left|\sum_i (r_i \cdot A_{is})\right|^2\right\} \cdot \frac{\gamma}{2} +$$
$$\left\{\sum_i (|r_i|^2 \cdot A_{ip}^2) + \sum_i (|r_i|^2 \cdot A_{is}^2)\right\} \cdot \frac{1-\gamma}{2}$$

wherein $r_1$ is the amplitude of reflection signal from I-th element in said at least one cycle; $A_{ip}$ and $A_{is}$ are filling factors corrected in accordance with effects of size coupling and dissipation in a cavity-like structure and s- and p-polarizations associated with the i-th element in said at least one cycle, respectively; $\gamma$ is a degree of coherence.

29. The apparatus according to claim 29, wherein said theoretical data is determined according to the following equation:

$$R_{2D} = \frac{\sum_{i=1}^{k} G_i \cdot R_{G_i}}{\sum_{i=1}^{k} G_i}$$

wherein $R_{Gi}$ and $G_i$ are the reflection intensity from and width of the i-th element; k is the total number of elements.

30. The apparatus according to claim 23, wherein said structure comprises at least one additional cycle formed of at least two different locally adjacent elements aligned along an axis perpendicular to an axis of alignment of the elements of said at least one cycle.

31. The apparatus according to claim 23, wherein each of said at least two elements is a stack including layers having different optical properties.

32. The apparatus according to claim 23, wherein said at least one desired parameter to be measured is a width of at least one of said at least two locally adjacent elements in the grid cycle.

33. The apparatus according to claim 31, wherein said at least one desired parameter to be measured is a width of at least one of said at least two locally adjacent elements in the grid cycle.

34. The apparatus according to claim 31, wherein said at least one desired parameter to be measured is a depth of at least one layer of said at least one stack.

35. The apparatus according to claim 31, wherein said at least one desired parameter to be measured is a depth of a metal-loss portion resulting from a chemical mechanical polishing applied to said structure.

* * * * *

UNITED STATES PATENT AND TRADEMARK OFFICE
CERTIFICATE OF CORRECTION

PATENT NO. : 6,100,985
DATED : August 8, 2000
INVENTOR(S) : Scheiner et al.

Page 1 of 2

It is certified that error appears in the above-identified patent and that said Letters Patent is hereby corrected as shown below:

<u>On the Face of the Patent</u>:

After "[22] Filed: March 12, 1999" insert

-- Related U.S. Application Data

[63] Continuation-in-part of Ser. No. 09/092,378, filed Jun. 5, 1998, now abandoned.

[30] Foreign Application Priority Data

March 18, 1998 [IL] Israel.................123727-- therefor,

In Section "[56] References Cited"

delete "5,900,633 3/1999 Solomon et al" and insert --5,900,633 5/1999 Solomon et al--therefor,

UNITED STATES PATENT AND TRADEMARK OFFICE
CERTIFICATE OF CORRECTION

PATENT NO. : 6,100,985
DATED : August 8, 2000
INVENTOR(S) : Scheiner et al.

It is certified that error appears in the above-identified patent and that said Letters Patent is hereby corrected as shown below:

In the Specification:

Before the first line    insert --This Patent is a continuation-in-Part of Serial No. 09/092,378 filed on June 5, 1998, which has now been abandoned Signed and Sealed this Fifteenth Day of May, 2001

Attest:

NICHOLAS P. GODICI

Attesting Officer    Acting Director of the United States Patent and Trademark Office